US 10,222,400 B2

(12) United States Patent
Une et al.

(10) Patent No.: US 10,222,400 B2
(45) Date of Patent: Mar. 5, 2019

(54) BEAM CURRENT MEASURING DEVICE AND CHARGED PARTICLE BEAM IRRADIATION APPARATUS

(71) Applicant: NISSIN ION EQUIPMENT CO., LTD., Kyoto-shi, Kyoto (JP)

(72) Inventors: Hideyasu Une, Billerica, MA (US); Tetsuro Yamamoto, Billerica, MA (US); Yoshihiro Takigami, Kyoto (JP)

(73) Assignee: NISSIN ION EQUIPMENT CO., LTD., Kyoto-shi, Kyoto (JP)

(*) Notice: Subject to any disclaimer, the term of this patent is extended or adjusted under 35 U.S.C. 154(b) by 181 days.

(21) Appl. No.: 15/271,854

(22) Filed: Sep. 21, 2016

(65) Prior Publication Data

US 2018/0080959 A1 Mar. 22, 2018

(51) Int. Cl.
G01R 15/24 (2006.01)
G01R 19/00 (2006.01)
H01J 25/12 (2006.01)

(52) U.S. Cl.
CPC ....... G01R 19/0061 (2013.01); G01R 15/246 (2013.01); G01R 19/0092 (2013.01); H01J 25/12 (2013.01)

(58) Field of Classification Search
CPC ............ G01R 19/0061; G01R 19/0092; G01R 15/246; H01J 25/12

USPC ................................................... 324/71.3, 96
See application file for complete search history.

(56) References Cited

U.S. PATENT DOCUMENTS

| 5,068,539 A | 11/1991 | Nogami et al. |
| 7,132,672 B2* | 11/2006 | Walther ............ H01J 37/32935 |
| | | 250/492.3 |
| 2006/0097195 A1* | 5/2006 | Angel ....................... G01T 1/29 |
| | | 250/492.21 |

FOREIGN PATENT DOCUMENTS

| JP | 3-114127 A | 5/1991 |
| JP | 557754 U | 7/1993 |
| JP | 2000082432 A | 3/2000 |

OTHER PUBLICATIONS

Communication dated Nov. 12, 2018, from the Japanese Patent Office in counterpart application No. 2017-018150.

* cited by examiner

Primary Examiner — Amy He
(74) Attorney, Agent, or Firm — Sughrue Mion, PLLC

(57) ABSTRACT

A beam current measuring device capable of performing measurement of a beam current distribution of a charged particle beam seamlessly and continuously in an arbitrary direction is provided. The beam current measuring device includes collector electrodes whose detection regions seamlessly continue in an arrangement direction thereof.

10 Claims, 6 Drawing Sheets

BEAM CURRENT MEASURING DEVICE AND CHARGED PARTICLE BEAM IRRADIATION APPARATUS

BACKGROUND

1. Field

Exemplary embodiments relate to a beam current measuring device for performing measurement of a beam current, and a charged particle beam irradiation apparatus equipped with the beam current measuring device.

2. Description of the Related Art

There has been known a charged particle beam irradiation apparatus configured to irradiate a target to perform processing of the target. Specific examples of the charged particle beam irradiation apparatus include a type using an ion beam, such as an ion implantation apparatus and an ion beam etching apparatus, and a type using an electron beam, such as an electron beam lithography apparatus and an electron beam irradiation apparatus.

In such apparatuses, a Faraday cup composed of a cup-shaped collector electrode is employed as a measuring device for measuring a beam current of a charged particle beam used for processing of a target. In the beam current measurement using a Faraday cup, only one Faraday cup may be used to measure a beam current at an arbitrary position, while in some cases a plurality of Faraday cups are used to measure a beam current distribution in an arbitrary direction.

FIG. 6 depicts a related art beam current measuring device having a configuration for measuring a beam current distribution in an arbitrary direction by using a plurality of Faraday cups.

The Y direction in FIG. 6 indicates a scanning direction of a spot-shaped ion beam IB, and the Z direction indicates a traveling direction of the ion beam IB. The X direction indicates a direction orthogonal to the Y direction and the Z direction.

A plurality of Faraday cups FC are arranged on an insulating support plate 2 side-by-side along the Y direction, and a non-depicted ammeter is connected to the Faraday cups FC. Each of a mask 21 and a secondary electron suppression electrode 22 applied with a negative pressure is formed with a plurality of openings H each corresponding to a respective one of the Faraday cups FC. Thus, the ion beam IB is allowed to enter each of the Faraday cups FC through a corresponding one of the openings H, so that it is possible to measure a beam current distribution in the Y direction. The mask 21, the electrode 22, the Faraday cups FC and other components are housed in a non-depicted housing, and constructed as a unit, e.g., an attachable-detachable unit.

In the related art beam current measuring device depicted in FIG. 6, the Faraday cups FC are arranged with an interspace between adjacent ones of the Faraday cups FC in the Y direction, and therefore there is a disadvantage in that it is impossible to measure a beam current in the interspace region because of the absence of a Faraday cup FC therein.

SUMMARY

It is an aspect to provide a beam current measuring device capable of performing measurement of a beam current distribution seamlessly and continuously.

According to various exemplary embodiments, there is provided a beam current measuring device for measuring a beam current distribution of a charged particle beam. The beam current measuring device comprises a plurality of collector electrodes whose detection regions seamlessly continue in an arrangement direction thereof.

The plurality of collector electrodes are physically in a non-contact state with respect to each other, so that the measurement of a beam current distribution can be performed as with the related art technique. In addition, the detection regions (i.e., regions for detecting a beam current) seamlessly continue, so that it becomes possible to measure a beam current of the charged particle beam seamlessly and continuously in the arrangement direction of the collector electrodes.

Adjacent ones of the collector electrodes may partially overlap each other, when viewing the collector electrodes from a beam receiving side with respect to the collector electrodes.

According to this feature, it becomes possible to measure more precisely beam components which obliquely irradiate each of the collector electrodes.

The above beam current measuring device may further comprise a switching circuit configured to selectively switch a target one or more of the collector electrodes to be used for the measurement.

According to this feature, it becomes possible to use an ammeter in a shared manner.

The beam current measuring device may further comprise a beam forming mask and a secondary electron suppression electrode each located on a beam receiving side with respect to the collector electrodes, wherein each of the mask and the electrode is formed with a single opening corresponding to the plurality of collector electrodes, when viewed from the beam receiving side with respect to the mask and the electrode.

According to various exemplary embodiments, the beam current measuring device comprises the plurality of collector electrodes whose detection regions seamlessly continue in the arrangement direction thereof, so that there is a low possibility that irradiation of an interspace between adjacent ones of the collector electrodes with the beam causes a short circuit between the adjacent collector electrodes. Thus, it is only necessary to form a single opening corresponding to the plurality of collector electrodes, in each of the beam forming mask and the secondary electron suppression electrode each located on the beam receiving side with respect to the collector electrodes, without the need to form therein a plurality of openings each corresponding to a respective one of the collector electrodes.

According to various exemplary embodiments, there is also provided a charged particle beam irradiation apparatus which comprises the above beam current measuring device; a beam transport path; and a target processing chamber, wherein the beam current measuring device is provided in the beam transport path or the target processing chamber.

The plurality of collector electrodes may be physically in a non-contact state with respect to each other, so that the measurement of a beam current distribution can be performed as with the conventional technique. In addition, the detection regions (i.e., regions each for detecting a beam current) seamlessly continue, so that it becomes possible to measure a beam current of the charged particle beam seamlessly and continuously in the arrangement direction of the collector electrodes.

BRIEF DESCRIPTION OF THE DRAWINGS

FIGS. 1A and 1B are schematic sectional views of a beam current measuring device according to one or more exemplary embodiments, wherein FIG. 1A depicts the beam current measuring device along the Y-Z plane, and FIG. 1B depicts the beam current measuring device along the X-Z plane;

FIGS. 2A and 2B are explanatory diagrams of a beam current measurement using a switching circuit according to one or more exemplary embodiments, wherein FIG. 2A depicts one example a circuit configuration for measuring a sum of beam currents measured by a plurality of collector electrodes, and FIG. 2B depicts one example a circuit configuration for measuring a beam current while sequentially switching a target one of the collector electrodes to be used for the measurement;

DESCRIPTION OF EXEMPLARY EMBODIMENTS

Figure 6:
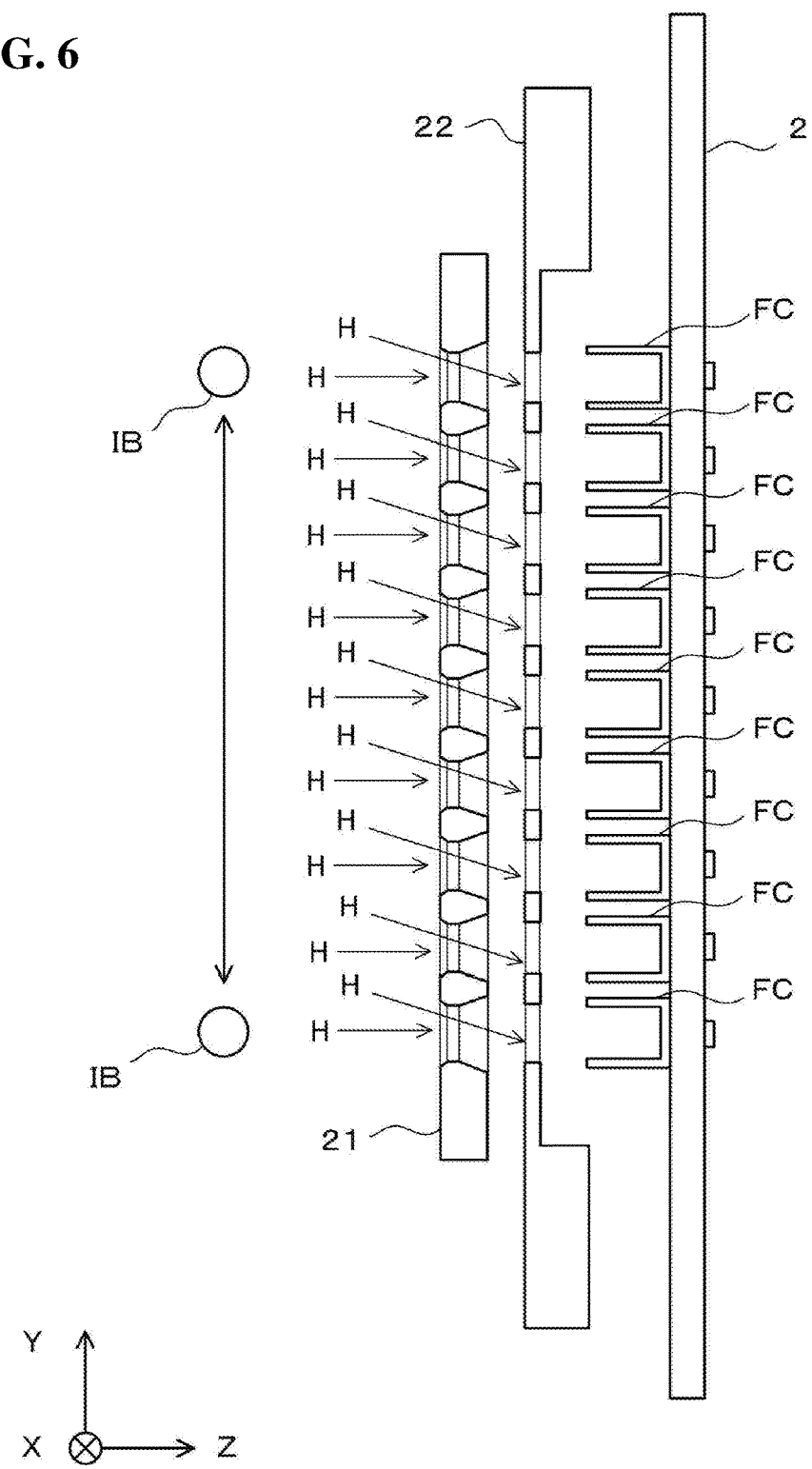
FIG. 6 is a schematic sectional view depicting a related art beam current measuring device.

An irradiation region of a target to be irradiated with an ion beam partially includes a zone unmeasurable by the beam measuring device as shown in FIG. 6. When a beam current of the ion beam in the zone unmeasurable by the beam measuring device is extremely large or extremely small, as compared with that in the remaining irradiation region, there is a disadvantage that processing/treatment of the target becomes bad even when a measured beam current or beam current distribution has a normal value. On this point, a beam current measuring device using an electron beam is also in the same situation.

With reference to FIG. 1, a basic configuration of a beam current measuring device BD according to one or more exemplary embodiments will now be described with a focus on a difference from a related art beam current measuring device depicted in FIG. 6.

A target to be measured by the beam current measuring device BD depicted in FIG. 1 is a beam current distribution of an ion beam IB scanned in a Y direction, as with the configuration of the conventional beam current measuring device depicted in FIG. 6. The definitions of X, Y and Z axes and the configuration of an element or component designated using the common reference code to that in FIG. 6 are the same as those described in connection with FIG. 6.

Figures 1A, 1B:
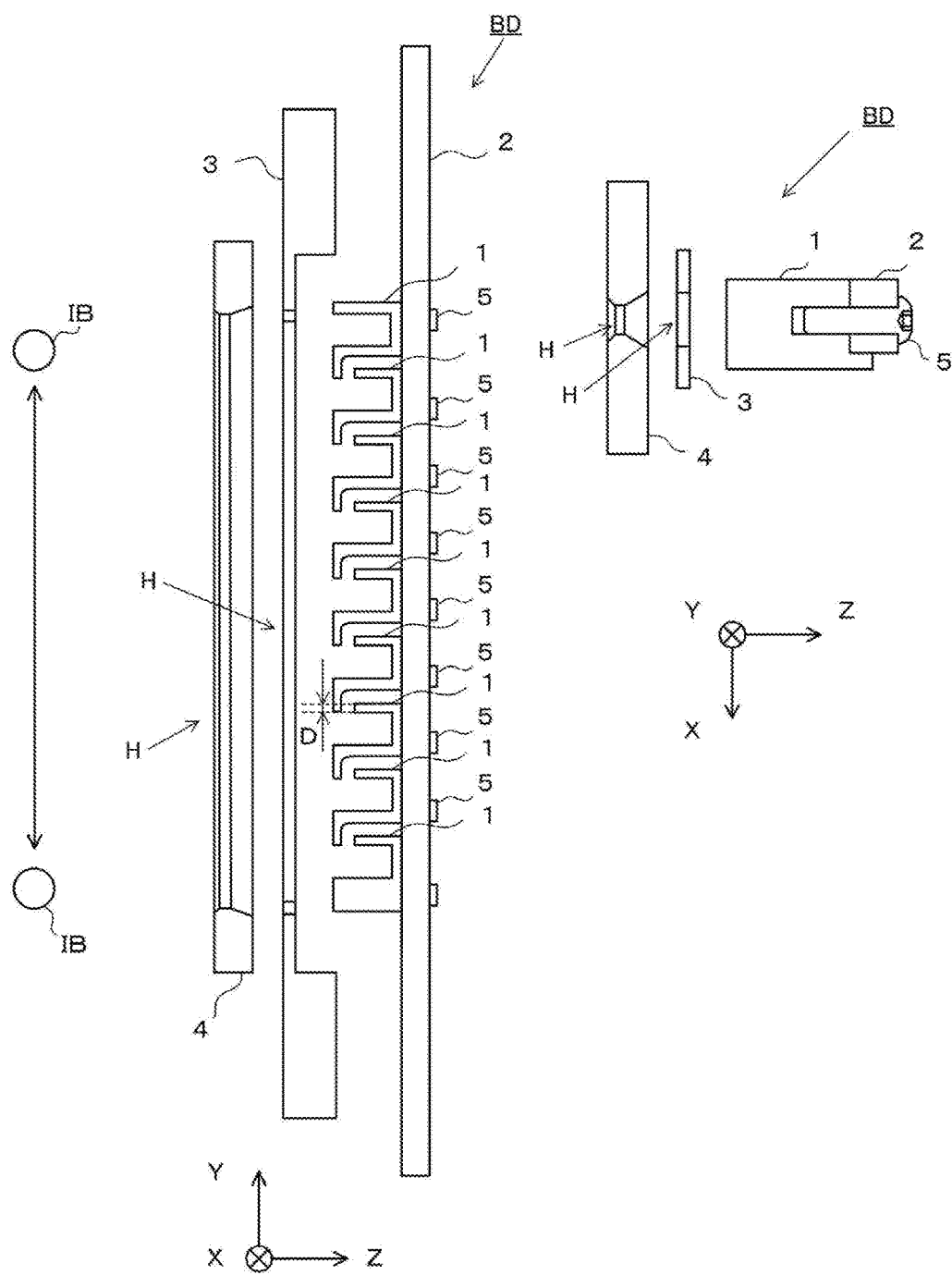

FIG. 1(A) depicts the beam current measuring device BD along the Y-Z plane, and FIG. 1(B) depicts the beam current measuring device BD along the Z-X plane.

A plurality of collector electrodes 1 are arranged along the Y direction. Each of the collector electrodes 1 is fixed onto an insulating support plate 2 by a measurement terminal 5 additionally serving as a fixing screw. A non-depicted ammeter is connected to the measurement terminals 5 to perform measurement of a beam current via each of the collector electrodes 1.

When viewing the collector electrodes 1 from a beam (ion beam IB) receiving side with respect to the collector electrodes 1, Y-directionally adjacent ones of the collector electrodes 1 partially overlap each other in an area indicated by D in FIG. 1A, so that regions (detection regions) used for detection of a beam current in the respective collector electrodes 1 are formed in such a manner as to seamlessly continue in an arrangement direction of the collector electrodes 1.

The term "detection region" mentioned here is equivalent to a region in which the collector electrode 1 receives the ion beam IB, i.e., a region of the collector electrode 1 which is exposed to the ion beam IB.

The beam current measuring device BD is equipped with the collector electrodes 1 configured as above, so that it becomes possible to perform a beam current measurement in an interspace between the adjacent collector electrodes, which is unmeasurable by the related art beam current measuring device.

As to the overlap area D between the adjacent collector electrodes 1, when the ion beam IB as a measurement target irradiates each of the adjacent collector electrodes 1 in a direction substantially parallel to a Z direction, the overlap area D may be zero.

Even in this configuration, the detection regions of the collector electrodes 1 are formed in such a manner as to seamlessly continue in the Y direction.

On the other hand, depending on a Z-directional thickness of each of the collector electrodes 1, when a traveling direction of the ion beam IB is oblique with respect to the Z direction, a part of the ion beam IB is likely to undesirably irradiate a portion of the insulating support plate 2 located between adjacent ones of the collector electrodes 1. Considering this, the collector electrodes 1 are desirably configured such that the overlap area D becomes greater than zero, i.e., such that the detection regions of the adjacent collector electrodes 1 partially overlap each other.

Each of a mask 4 and a secondary electron suppression electrode 3 may be configured such that it is formed with a plurality of openings corresponding to the collector electrodes 1, as with the conventional technique. However, in this configuration, a part of the ion beam IB shielded by a non-opening portion of each of the mask 4 and the electrode 3 does not irradiate a specific area of the collector electrodes 1, and thereby it becomes impossible to measure a beam current in the specific area.

For this reason, each of the mask 4 and the secondary electron suppression electrode 3 is desirably configured such that it is formed with a single opening H corresponding to all of the collector electrodes 1, as depicted in FIG. 1, to allow a beam current of the ion beam IB to be detected over a wide range through the single opening H.

The mask 4 is connected to the ground, and the secondary electron suppression electrode 3 is applied with a negative voltage on the basis of a ground potential.

In the measurement of a beam current, the ammeter may be provided, for example, by a number equal to that of collector electrodes 1. However, considering that an apparatus cost becomes higher along with an increase in the number of ammeters, a switching circuit may be used to allow one ammeter to be shared by two or more collector electrodes 1.

Figure 2A:
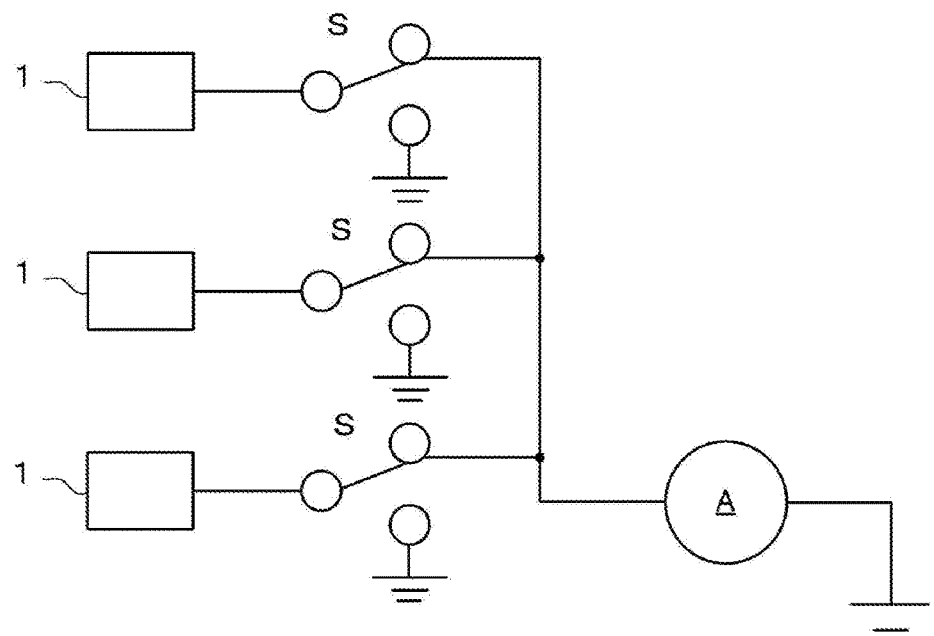
Figure 2B:
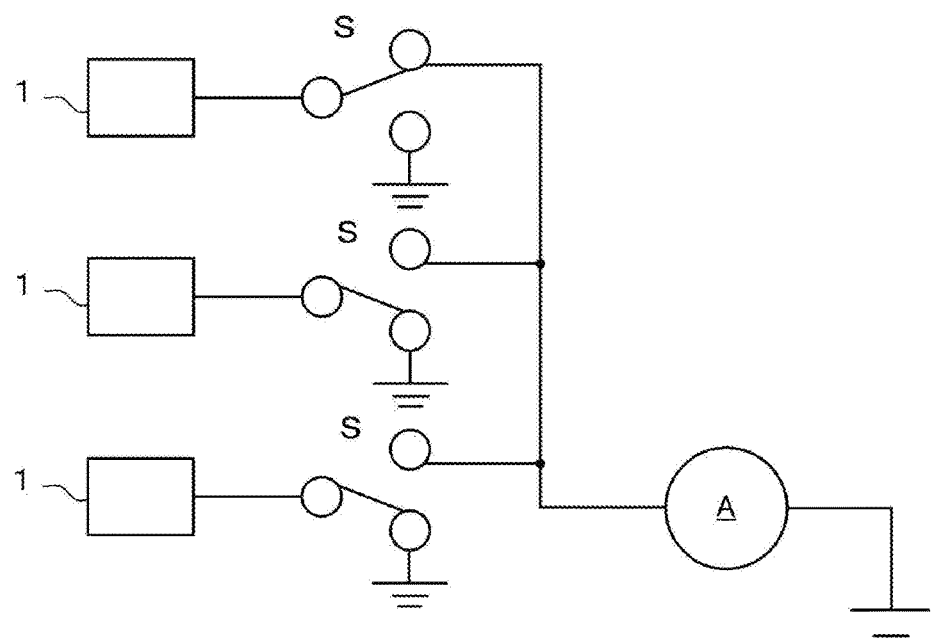

As one example, FIGS. 2A and 2B depict an example in which one ammeter is shared by three collector electrodes 1. For example, a switching circuit S may be provided between each of the collector electrodes 1 and the ammeter. The switching circuit S is a circuit configured to switch a target one of the collector electrodes 1 to be used for the measurement by the ammeter.

As depicted in FIG. 2A, all of the three switching circuits S connected to the respective collector electrodes 1 can be set to an ON state so as to measure a sum of beam currents detected by the three collector electrodes 1.

Alternatively, as depicted in FIG. 2B, one of the three switching circuits S connected to the respective collector electrodes 1 and the remaining switching circuits S can be set, respectively, to the ON state and an OFF state so as to measure a beam current detected by an arbitrary one of the collector electrodes 1. Alternatively, a target one of the switching circuits S to be set to the ON state can be sequentially switched so as to perform measurement of a beam current through each of the collector electrodes 1 to know a beam current distribution.

Although FIG. 2 depicts the configuration in which one ammeter is used with respect to two or more collector electrodes 1, the number of ammeters is not limited thereto. For example, two ammeters may be used.

Figure 3:
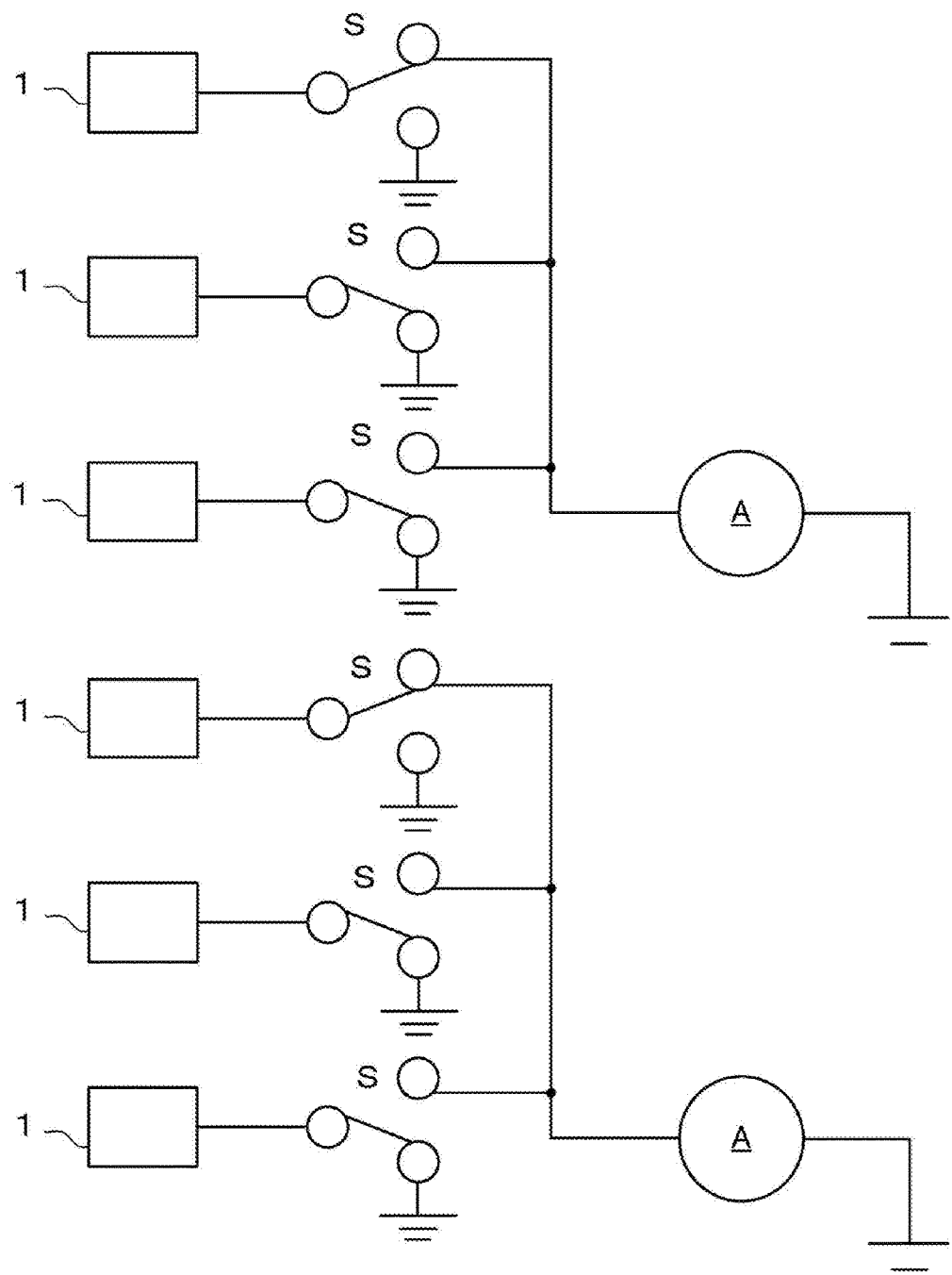
FIG. 3 is an explanatory diagram of a beam current measurement using a plurality of ammeters, according to one or more exemplary embodiments.

FIG. 3 depicts one example in which two ammeters are used, wherein the collector electrodes 1 are divided into two groups corresponding to the respective ammeters. In the measurement of a beam current distribution, in each of the groups, a target one of the switching circuits S to be set to the ON state is sequentially switched so as to perform measurement of a beam current through each of the collector electrodes 1. The use of this technique makes it possible to shorten a time required for the measurement of a beam current distribution.

Figure 4:
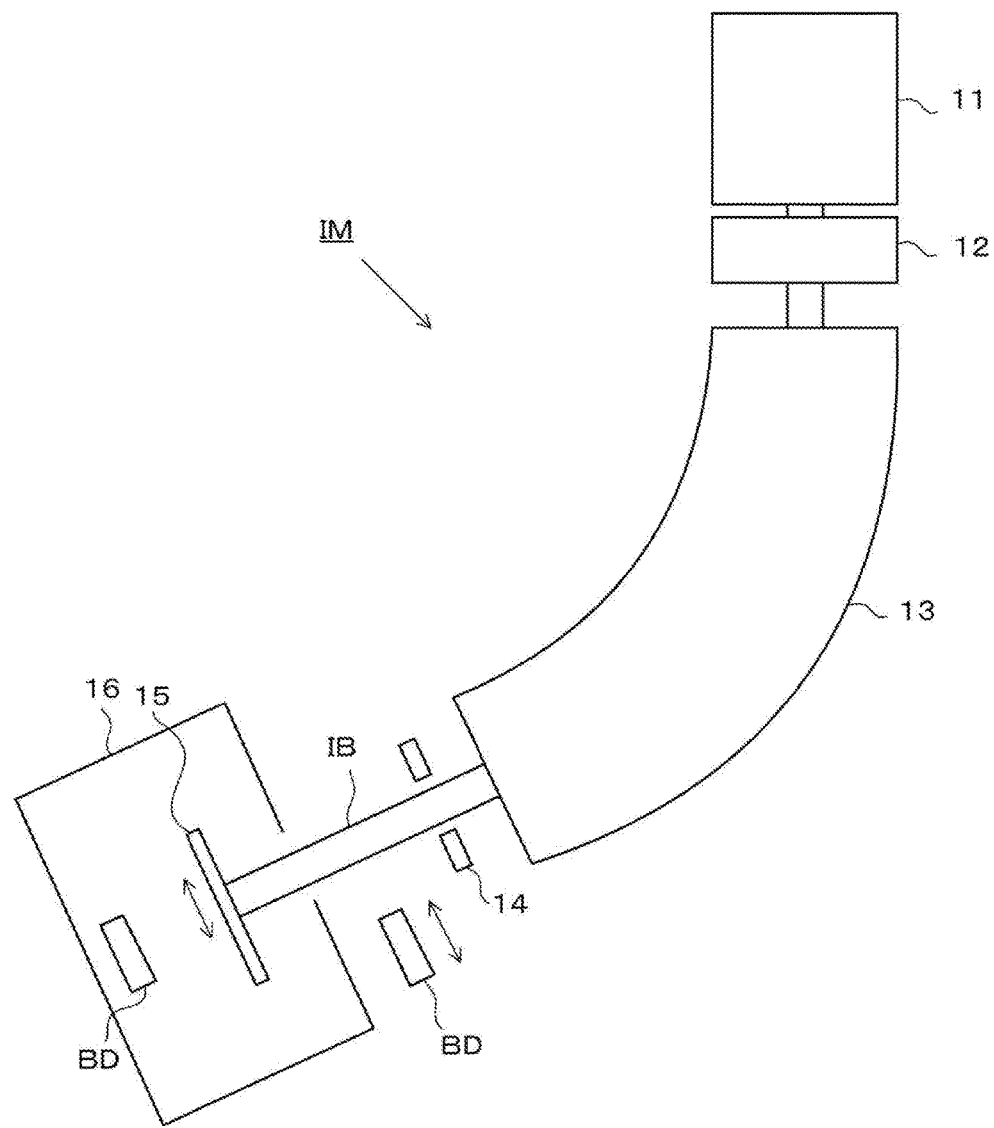
FIG. 4 is a schematic top plan view of a charged particle beam irradiation apparatus comprising a beam current measuring device, according to one or more exemplary embodiments.

When the aforementioned beam current measuring device BD is used in a charged particle beam irradiation apparatus, it is contemplated to construct an apparatus configuration as depicted, for example, in FIG. 4.

FIG. 4 depicts a typical ion implantation apparatus IM configured to transport an ion beam IB from an ion source 11 to a processing chamber 16 through an extraction electrode 12, a mass analysis electromagnet 13 and an analysis slit 14, and irradiate a target 15 scanned in one direction within the processing chamber 16 with the ion beam IB.

In this ion implantation apparatus IM, the beam current measuring device BD is disposed in a transport path of the ion beam IB or the processing chamber 16.

When needed, the beam current measuring device BD may be movably supported by a non-depicted movement mechanism in such a manner that it can be moved in and out with respect to the transport path of the ion beam IB. The movement mechanism may be configured to move the beam current measuring device BD in two orthogonal directions, as well as in one direction, so as to perform measurement of a beam current at an arbitrary position.

The beam current measuring device BD may also be configured to be supported in the processing chamber 16 by a movement mechanism, in the same manner as that in the transport path. Alternatively, the beam current measuring device BD may be fixed on a downstream side of an irradiation position of the ion beam IB with respect to the target 15.

In the above embodiment, the collector electrodes 1 are arranged in one straight line. However, an arrangement pattern of the collector electrodes 1 is not limited thereto. For example, the collector electrodes 1 may be arranged in a cross-like pattern, or may be arranged in a plurality of lines, such as two lines or three lines, in the case where a measurement region is segmentalized. Furthermore, the collector electrodes 1 may be formed in different shapes.

Figure 5:
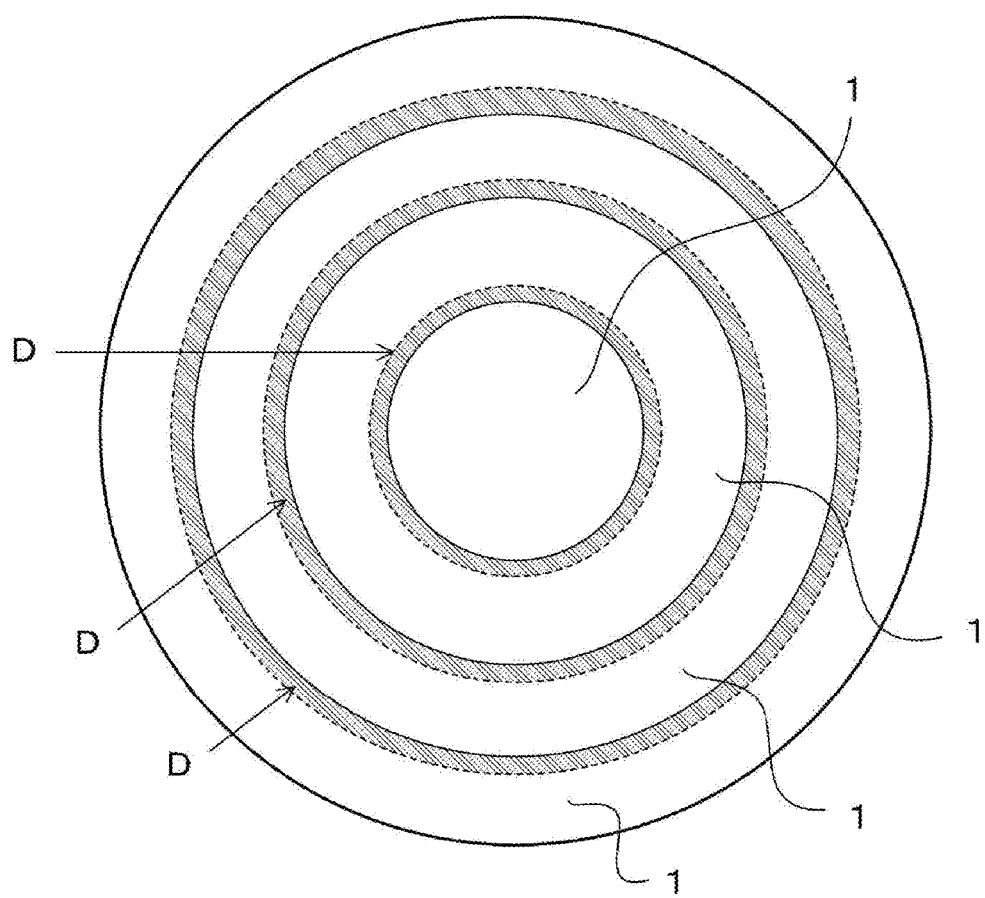
FIG. 5 is an explanatory diagram of another arrangement configuration of a plurality of collector electrodes according to one or more exemplary embodiments.
Figure 5:
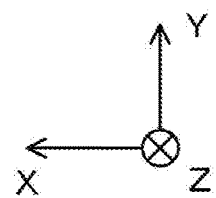

As an example in which the collector electrodes are formed in different shapes, a plurality of collector electrodes 1 may be arranged to have a concentrically spreading pattern, as depicted in FIG. 5. FIG. 5 depicts a beam current measuring device when viewed from a beam receiving side with respect to the beam current measuring device, wherein depiction of the mask 4 and the secondary electron suppression electrode 3 in FIG. 1 is omitted.

Although the above embodiment has been described about the measurement of a beam current of an ion beam, the measurement target may be an electron beam, or may be a charged particle beam in a broad sense.

The shape of the ion beam is not limited to a spot shape, but may be a sheet shape which is long in one direction, or a ribbon shape.

Further, in the case where the beam current measuring device BD is used in the vicinity of a plasma source for suppressing charge-up of a target or divergence of an ion beam, a suppression electrode configured to be applied with a positive voltage on the basis of a ground potential may be added between the mask 2 and the secondary electron suppression electrode 3 in FIG. 1.

The shape of each of the correction electrodes 1 is not limited to the shape disclosed in FIG. 1. In this case, what is essential is that the detection regions of the collector electrodes 1 seamlessly continue in the arrangement direction of the collector electrodes 1. Thus, for example, a portion of the collector electrode 1 extending horizontally or perpendicularly with respect to a flat surface of the insulating support plate 2 may be modified to extend obliquely with respect to the flat surface.

In view of a beam current distribution, accurate measurement of a beam current in each of the collector electrodes 1 is not needed. That is, as long as each of the collector electrodes 1 has the same level of measurement accuracy, an approximately correct value of the beam current distribution can be calculated because the beam current distribution is obtained in the form of a ratio between respective beam currents measured by the collector electrodes 1. Considering this, a configuration in which a small number of secondary electrons jump out from a cup-shaped portion of the collector electrode 1 may be employed. In an extreme case, each of the collector electrodes 1 may have a configuration devoid of a cup-shaped or concave portion.

What is claimed is:

1. A beam current measuring device for measuring a beam current distribution of a charged particle beam, comprising a plurality of collector electrodes arranged in a single row in an arrangement direction and physically separated from one another, and whose detection regions seamlessly continue in the arrangement direction thereof.

2. The beam current measuring device as recited in claim 1, wherein adjacent ones of the collector electrodes partially overlap each other, when viewing the collector electrodes from a beam receiving side with respect to the collector electrodes.

3. The beam current measuring device as recited in claim 2, which further comprises a switching circuit configured to selectively switch a target one or more of the collector electrodes to be used for the measurement.

4. The beam current measuring device as recited in claim 1, which further comprises a beam forming mask and a secondary electron suppression electrode each located on a beam receiving side with respect to the collector electrodes, each of the mask and the electrode being formed with a single opening corresponding to the plurality of collector electrodes, when viewed from the beam receiving side with respect to the mask and the electrode.

5. The beam current measuring device as recited in claim 1, wherein the collector electrodes are Faraday cups.

6. A charged particle beam irradiation apparatus comprising:

a beam current measuring device as recited in claim 1;

a beam transport path; and a processing chamber for processing therein a target, wherein the beam current measuring device is provided in the beam transport path or the processing chamber.

7. The charged particle beam irradiation apparatus as recited in claim 5, wherein the collector electrodes are Faraday cups.

8. A beam current measuring device comprising:

a plurality of collector electrodes arranged adjacent to each other and separated from each other along a line, the detection regions of the collector electrodes continuing seamlessly along the line.

9. The beam current measuring device as recited in claim 8, wherein the collector electrodes are Faraday cups.

10. The beam current measuring device as recited in claim 8, wherein adjacent ones of the collector electrodes partially overlap each other, when viewing the collector electrodes from a beam receiving side with respect to the collector electrodes.

\* \* \* \* \*